United States Patent
Dalla Libera et al.

(10) Patent No.: US 6,548,857 B2
(45) Date of Patent: Apr. 15, 2003

(54) LOW RESISTANCE CONTACT STRUCTURE FOR A SELECT TRANSISTOR OF EEPROM MEMORY CELLS IN A NO-DPCC PROCESS

(75) Inventors: Giovanna Dalla Libera, Monza (IT); Bruno Vajana, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/052,980

(22) Filed: Jan. 17, 2002

(65) Prior Publication Data

US 2002/0060349 A1 May 23, 2002

Related U.S. Application Data

(63) Continuation of application No. 09/422,523, filed on Oct. 20, 1999, now abandoned.

(51) Int. Cl.[7] ................................. H01L 29/72
(52) U.S. Cl. ................. 257/315; 257/316; 257/321; 257/756; 257/773; 257/774
(58) Field of Search ................ 257/756, 773, 257/774, 315, 316, 321

(56) References Cited

U.S. PATENT DOCUMENTS

| | | | |
|---|---|---|---|
| 5,851,880 A | * 12/1988 | Ikegami | 257/756 |
| 5,326,999 A | 7/1994 | Kim et al. | 275/315 |

FOREIGN PATENT DOCUMENTS

| | | |
|---|---|---|
| EP | 0 581 312 A1 | 2/1994 |
| JP | 02 001176 A | 1/1990 |
| JP | 03 205 870 | 9/1991 |
| JP | 10 4149 | 1/1998 |

* cited by examiner

*Primary Examiner*—Edward Wojciechowicz
(74) *Attorney, Agent, or Firm*—Lisa K. Jorgenson; Robert Iannucci; Seed IP Law Group PLLC

(57) ABSTRACT

A semiconductor memory device having at least one memory cell row, each memory cell having an information storing element and a related select transistor for selecting the storing element. The select transistor includes a gate oxide region over a silicon substrate, a lower polysilicon layer and an upper polysilicon layer superimposed to the gate oxide region and electrically insulated by an intermediate dielectric layer interposed therebetween. The gate oxide regions of the select transistors of the at least one row are separated by field oxide regions, and the lower and upper polysilicon layers and the intermediate dielectric layer extend along the row over the gate oxide regions of the select transistors and over the field oxide regions. Along the row there is at least one opening in the upper polysilicon layer, intermediate dielectric layer and lower polysilicon layer, inside of which a first contact element suitable to electrically connect the lower and upper polysilicon layers is inserted.

17 Claims, 2 Drawing Sheets

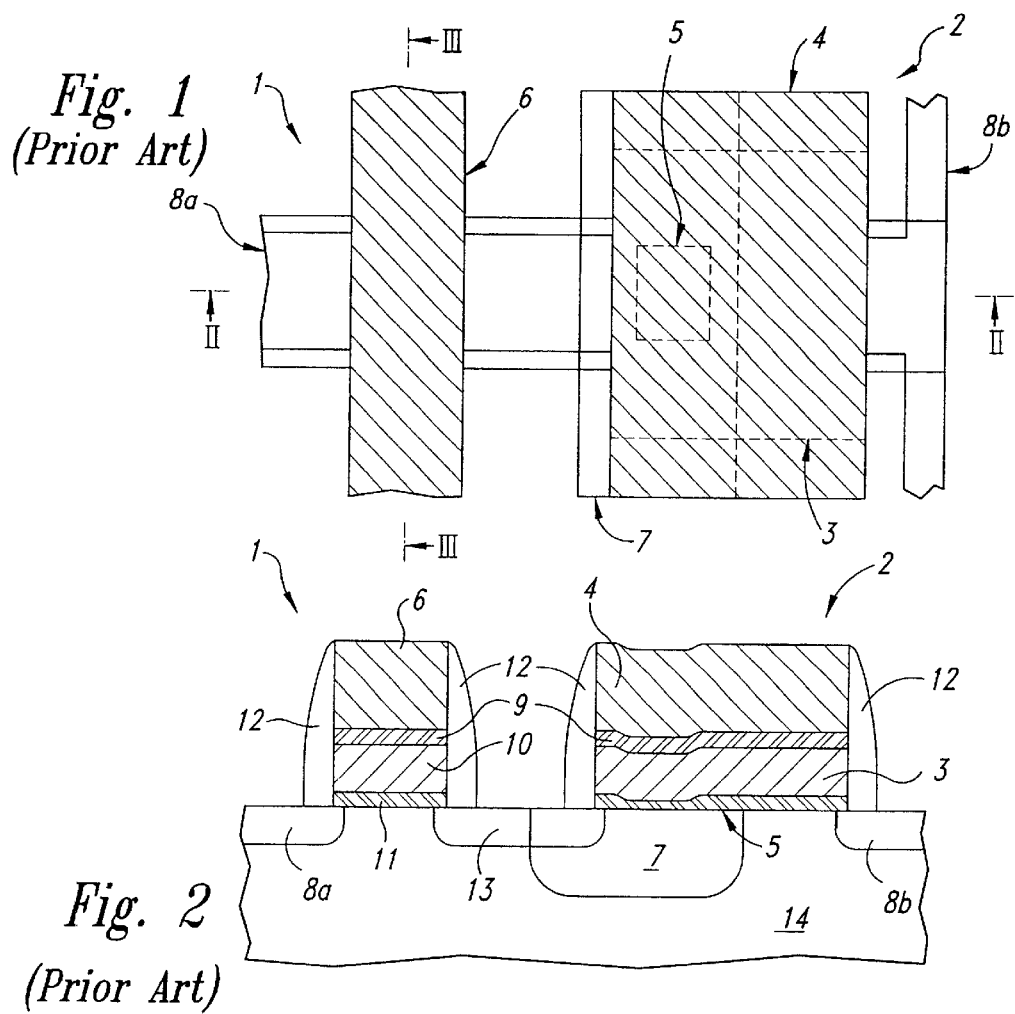
*Fig. 1*
(Prior Art)
*Fig. 2*
(Prior Art)
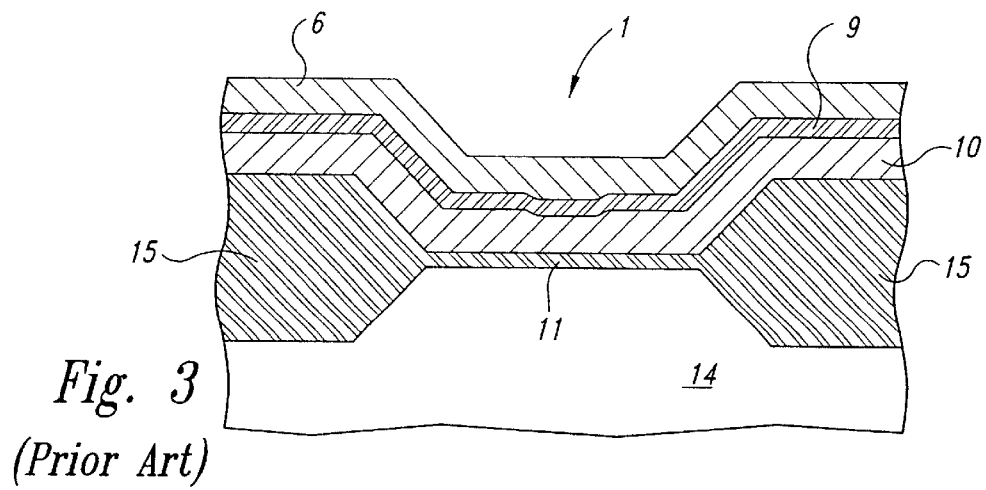
*Fig. 3*
(Prior Art)

LOW RESISTANCE CONTACT STRUCTURE FOR A SELECT TRANSISTOR OF EEPROM MEMORY CELLS IN A NO-DPCC PROCESS

CROSS-REFERENCE TO RELATED APPLICATION

This application is a continuation of U.S. patent application Ser. No. 09/422,523, filed Oct. 20, 1999 now abandoned, which application is incorporated herein by reference in its entirety.

BACKGROUND OF THE INVENTION

1. Field of the Invention

The present invention relates to a low resistance contact structure for a select transistor of EEPROM memory cells in a NO-DPCC process, that is, a process without short-circuited double polysilicon.

2. Description of the Related Art

In the present advanced process for manufacturing EEPROM memory devices it is quite difficult to obtain a good contact structure for a select transistor due to the high resistivity of the polysilicon layers constituting the transistor gates.

This difficulty is particularly present in the processes that do not provide short circuited double polysilicon (NO-DPCC) where the contact structure of the select transistor is obtained by means of complex process steps and expensive additional masks.

With reference to FIG. 1, a plan view of the geometrical structure of a conventional EEPROM memory cell is shown. The single memory cell is constituted by a select transistor 1, typical of nonvolatile EEPROM memories, connected in series to a storing transistor 2 wherein it can be noted a floating gate 3 (lower polysilicon) where the electrical charges are stored, a control gate 4 (upper polysilicon), a tunnel oxide area 5 (with a thickness of about 80 Å) through which the electrical charges pass, for Fowler-Nordheim effect, during the programming step. Moreover, there is an area wherein an implant 7 is obtained (usually using phosphorous as dopant) with the purpose of keeping an electrical continuity between the select transistor 1 and the tunnel area 5. The memory cell further includes drain regions 8a and source regions 8b, and an upper polysilicon layer 6 of the select transistor 1, which forms a word line of the memory matrix.

FIG. 2 shows a section view along line II—II of FIG. 1. It can be noted the superimposed layers structure both of the select transistor 1 and of the storing transistor 2.

The select transistor provides a gate oxide layer 11 over a silicon substrate 14, a lower polysilicon layer 10 and the upper polysilicon layer 6 superimposed to it. An intermediate dielectric layer 9 is provided between the two layers. Moreover, the dielectric layer 9 is present between the two polysilicon layers 3 and 4 of the storing transistor, the dielectric layer 9 may be formed by oxide-nitride-oxide (ONO), and has the purpose to electrically insulate the two layers.

The select transistor 1 has the same structure of the storing transistor 2, that is, lower polysilicon/intermediate dielectric/upper polysilicon, in order to preserve a planarity over the entire matrix.

Oxide spacers 12 are present at the sidewalls of the two transistors 1 and 2.

Provided between the two transistors, and connected in series with them, is a doped region 13 formed in the silicon substrate 14. The doped region 13 is equivalent to a source region for the select transistor 1 and to a drain region for the storing memory 2. The doped region 13 is electrically connected to the implant region 7 to keep an electrical connection between the select transistor 1 and the tunnel area 5.

FIG. 3 shows a section view along line III—III of FIG. 1. It should be noted that the select transistor 1 includes the two polysilicon layers 6 and 10, which are electrically insulated by the intermediate dielectric 9, even on field oxide regions 15 (LOCOS), as typically provided by a NO-DPCC process.

In a process providing short-circuited double polysilicon (DPCC not shown), the lower polysilicon and the upper polysilicon are short-circuited on the field oxide, using an appropriate mask, in order to make it possible to bias the select transistor gate by means of a contact on the upper polysilicon. Typically, this occurs every 8 memory cells (1 byte).

In a NO-DPCC process, there are problems related to defining a contact to the select transistor. FIG. 4 shows a section view, along a memory matrix row, of a select transistor obtained by means of a NO-DPCC process. A contact on the oxide field is present. The select transistor structure is analogous to that of FIG. 3, with the addition of an upper dielectric layer 16 formed over the entire device with the purpose of electrically insulating the polysilicon layers from possible superimposed metal layers. A contact element 17 (for example, formed from tungsten) is informed in the upper dielectric layer 16 over the field oxide 15, and has the purpose of connecting the lower polysilicon layer 10 with a metal line 18 in order to activate the select transistor gate.

The contact element 17 is connected to the lower polysilicon layer 10 rather than to the upper layer 6, as is typical in a DPCC process, because the two polysilicon layers are electrically insulated as a result of being manufactured by means of a NO-DPCC process.

However, there are problems related to such a contact structure. For example, unlike a DPCC process, no short-circuiting between the lower polysilicon 10 and the upper polysilicon 6 is provided, and so it is necessary to introduce one or more masks for directly contacting the lower polysilicon 10 of the select transistor 1. Additionally, the lower polysilicon 10 typically has a high resistance which result in problems with delay in the electrical signal propagation. Furthermore, the thickness of the lower polysilicon layer 10 is typically less than that of the upper polysilicon layer 6. Consequently, the process steps for defining polysilicon contacts can cause problems of breaking down the lower polysilicon 10.

As a result, in a NO-DPCC process that does not provide short-circuited double polysilicon, the manufacture of a contact structure for the select transistor becomes a very critical step.

BRIEF SUMMARY OF THE INVENTION

In view of the state of the art described, it is an object of the embodiments of the present invention to provide a low resistance contact structure for a select transistor of EEPROM memory cells in a NO-DPCC process.

According to embodiments of the present invention, such object is achieved by means of a semiconductor memory device, including at least one memory cell row. Each memory cell includes an information storing element and a related select transistor for selecting the storing element. The select transistor includes a gate oxide region over a silicon substrate, a lower polysilicon layer, and an upper polysilicon layer superimposed to said gate oxide region and electrically insulated therebetween by an intermediate dielectric layer interposed between them. The gate oxide regions of the select transistors are separated by field oxide regions. The lower and upper polysilicon layers, and the intermediate dielectric layer, extend along the row over the gate oxide regions of the select transistors and over the field oxide regions. Along the row is at least one opening in the upper polysilicon layer, the intermediate dielectric layer, and the lower polysilicon layer. A first contact element suitable to electrically connect said lower and upper polysilicon layers is inserted inside the opening.

The features and advantages of embodiments of the present invention will be made more evident by the following detailed description of a particular embodiment thereof, illustrated as a non-limiting example in the accompanying drawings.

BRIEF DESCRIPTION OF THE SEVERAL VIEWS OF THE DRAWINGS

FIG. 1 shows a plant view of an EEPROM memory cell included a related select transistor, according to the prior art.

FIG. 2 shows a section view along the line II—II of FIG. 1.

FIG. 3 shows a section view along the line III—III of FIG. 1.

DETAILED DESCRIPTION OF THE INVENTION

Figure 4:
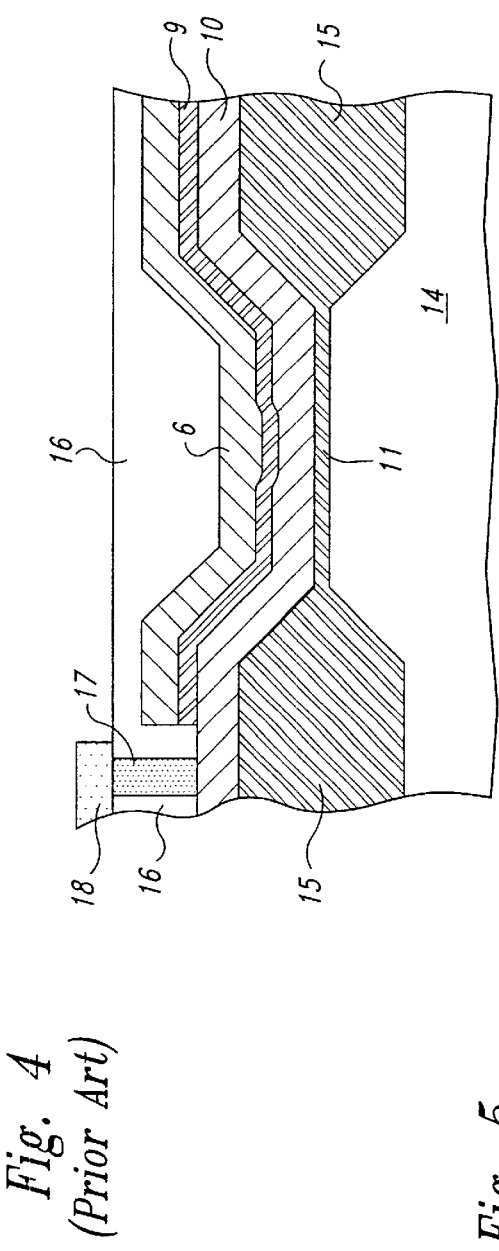
FIG. 4 shows a section view of a select transistor and of a contact structure obtained by means of a NO-DPCC process, according to the prior art.
Figure 5:
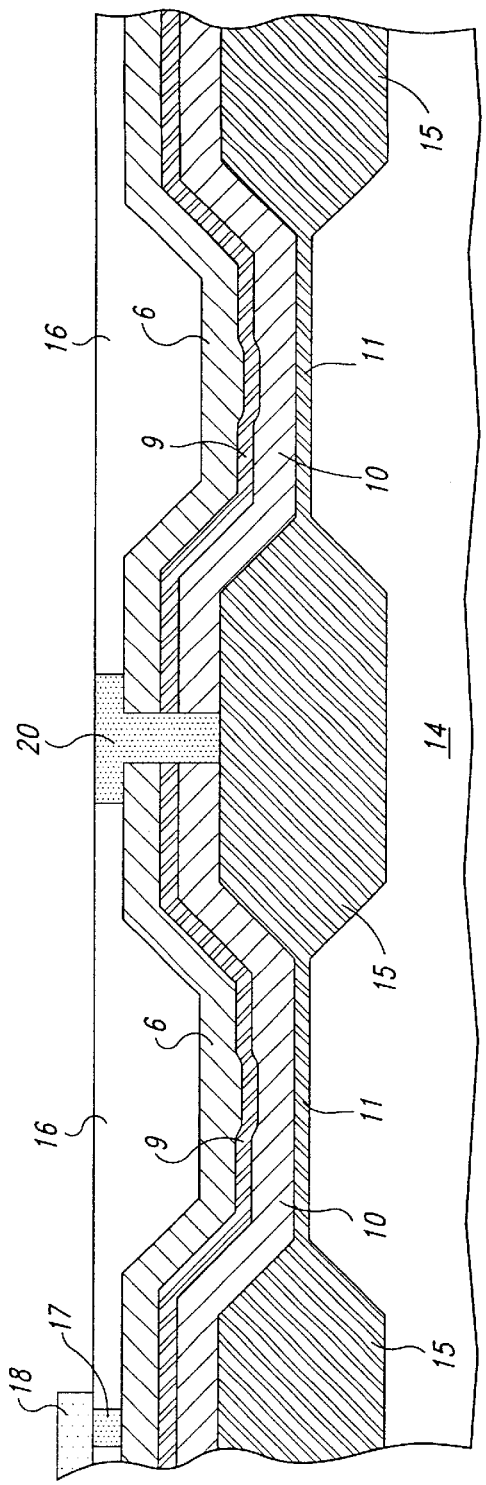
FIG. 5 shows a section view, along a row of an EEPROM memory matrix, of two contiguous select transistors and of a contact structure, according to the present invention.

With reference to FIG. 5, it can be observed that the two contiguous select transistors are structurally similar to the transistor shown in FIG. 4. However, the contact element 17, inserted in the upper dielectric layer 16 over the field oxide 15, connects the metal line 18 with the upper polysilicon layer 6. The select transistor gates may nevertheless be activated because of a further contact element 20. The contact element 20, which is not connected to any metal line, short-circuits the upper polysilicon layer 6 to the lower polysilicon layer 10 over the field oxide area 15, and simultaneously allows the electrical connection between the polysilicon layers 6 and 10 of the two contiguous select transistors.

To obtain a structure as described above, it may be necessary to modify some manufacturing process steps, and modify or introduce manufacturing masks.

A typical DPCC process of manufacturing a memory device as shown in FIG. 5 provides a first step of implantation, the definition of a tunnel area, the deposition of a lower polysilicon layer 10, and the definition of the floating gate by means of a proper selective etching. The process continues with the growth of an intermediate dielectric layer 9, a selective etching of the intermediate dielectric 9 and of the lower polysilicon 10 in the circuitry, the growth of gate oxide (not shown) in the circuitry, and the deposition of an upper polysilicon layer 6.

At this point the layout of the select transistor gates 1 and of the storing transistor control gates 2 are defined. A field oxide area 15 (for example every 8 cells or 1 byte) is also formed, from which an upper polysilicon 6 of the select transistor 1 is removed by means of a modified mask.

Subsequently, it is provided a consequent selective etching of the upper polysilicon 6, followed by a self-aligned etching of the intermediate dielectric 9 and of the lower polysilicon 10 in the matrix for defining the select transistors gates 1 and the memory cells control gates 2 (the circuitry is not etched). During this step the above-mentioned intermediate dielectric 9 and lower polysilicon layers 10 are also etched in the area previously defined on the field oxide and so the select transistor gates 1 are interrupted over the field oxide 15 every n cells (for example, every 8 cells).

The process then continues in a conventional manner, such as providing the deposition or growth of an upper dielectric layer 16 over the entire device, up to the contact definition step. In this step, a contact mask comprising an opening in the previously defined field oxide area is used, where the select transistor lines 1 (word lines) have been interrupted. Such an opening should be larger than the underlying opening between the two polysilicon layers 10 and 16. In order to avoid misalignment problems during the subsequent etching step.

At this point, a selective etching is performed to define the contacts. By removing the upper dielectric 16 from all the contacts and arriving at the upper polysilicon and moreover removing the upper dielectric 16 from the interrupted polysilicon area of the word line of the upper and lower polysilicon 10 and 6.

Subsequently, a conductive material, such as tungsten, is deposited to obtain contacts (plugs) 17 and 20, that completely fill the contacts. The lower and upper polysilicon layers 10 and 6 of the select transistor are short-circuited at the opened area in the word line, thus restoring the electrical continuity of the select transistor gate 1. The process then continues in a conventional manner.

In an alternative embodiment, the definition of the contact between the two polysilicon layers 10 and 6 can be obtained in a different step. Particularly, it can be made in a single step during the etching for the contact opening (so providing a single modified mask). In this case the etching turns out to be technologically more critical because it must be able to etch a sequence of different materials.

As a result of the contact structure, as shown in FIG. 5, a short-circuit between the lower and the upper polysilicon 10 and 6 of the select transistor 1 is obtained without adding any manufacturing mask to the conventional process flow. Moreover, there is no delay in the word line signal propagation and no process complications of contacting the lower polysilicon 10 because the contact to the select transistor 1 occurs with a conventional contact on the upper polysilicon 6.

However, attention should be given to obtain a good polishing of the walls of the two polysilicon layers 10 and 6 in the region where the short-circuit occurs. Additionally, contact etching should be accurately calibrated in order to avoid an excessive field oxide consumption in the contact region between the lower and upper polysilicon 10 and 6.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A semiconductor memory device, comprising:
   a row of memory cells, each memory cell comprising an information storing element and a related select transistor for selecting the storing element, said select transistor comprising a gate oxide region over a silicon substrate, a lower polysilicon layer and an upper polysilicon layer superimposed to said gate oxide region and electrically insulated therebetween by an intermediate dielectric layer interposed between them, the gate oxide regions of the select transistors of said row being separated by field oxide regions, said lower and upper polysilicon layers and said intermediate dielectric layer extending along said row over the gate oxide regions of the select transistors and over the field oxide regions, wherein along said row is an opening in said upper polysilicon layer, intermediate dielectric layer, and lower polysilicon layer, inside of which a first contact element suitable to electrically connect said lower and upper polysilicon layers is inserted, wherein the row further comprises an upper insulating layer positioned on the upper polysilicon layer, an upper conductive layer positioned on the upper insulating layer, and a second contact element that extends through the upper insulating layer to connect the upper conductive layer with the upper polysilicon layer, wherein the upper insulating layer insulates the first contact element from direct contact with the upper conductive layer.

2. The device according to claim 1 wherein said opening is provided over a first one of said field oxide regions.

3. The device according to claim 2 wherein said second contact element is positioned over a second one of said field oxide regions.

4. The device according to claim 1 wherein said first and second contact elements are formed from tungsten.

5. The device according to claim 1 wherein the second contact element has a bottom surface that contacts a top surface of the upper polysilicon layer.

6. A method of manufacturing a memory device having a memory cell row, each memory cell of said row having an information storing element and a related select transistor, the method comprising:

forming gate oxide regions and field oxide regions over a silicon substrate;

forming a lower polysilicon layer, an intermediate dielectric layer, and an upper polysilicon layer over said gate oxide regions and over said field oxide regions in order to define said row;

forming an opening in said upper polysilicon layer, intermediate dielectric layer and lower polysilicon layer;

forming inside said opening a related first contact element suitable to electrically connect said upper polysilicon layer with said lower polysilicon layer;

forming an upper insulating layer on the upper polysilicon layer;

forming an upper conductive layer on the upper insulating layer; and forming a second contact element that extends through the upper insulating layer and contacts the upper conductive layer and the upper polysilicon layer, wherein the upper insulating layer insulates the first contact element from direct contact with the upper conductive layer.

7. The method according to claim 6 wherein forming said opening comprises, after the formation of said lower and upper polysilicon layers and of said intermediate dielectric layer and before forming said first contact element, selectively self-aligned etching said upper polysilicon layer, intermediate dielectric layer and lower polysilicon layer.

8. The method according to claim 6, further comprising, after forming said opening and before forming said first contact element, forming said upper insulating layer over said upper polysilicon layer and selectively etching said upper insulating layer over said opening.

9. The method according to claim 6, further comprising, after forming said lower and upper polysilicon layers and said intermediate dielectric layer, and before forming said opening, forming the upper insulating layer and then forming the opening by selectively etching said upper insulating layer, upper polysilicon layer, intermediate dielectric layer and lower polysilicon layer.

10. The method according to claim 6, wherein said opening is provided over one of said field oxide regions.

11. The method according to claim 6, wherein forming said first contact element comprises a step of depositing tungsten in said opening.

12. The method according to claim 6 wherein the second contact element has a bottom surface that contacts a top surface of the upper polysilicon layer.

13. The method according to claim 6, wherein said opening is a first opening that extends through the upper insulating layer and forming said second contact element is preceded by forming a second opening in the upper insulating layer, wherein said first and second contact elements are formed simultaneously by depositing conductive materials in the first and second openings.

14. A memory cell array, comprising memory cells arranged in rows of word lines and separated by field oxide regions, each memory cell having a data storage element and a selection transistor integrated into a respective word line to select a row of data storage elements, each word line having first and second polysilicon layers and a dielectric layer disposed therebetween, a first conductive plug electrically coupling together first and second separated regions of said word line and further coupling together said first and second polysilicon layers, an upper conductive layer for activating the word line, a second conductive plug connecting the upper conductive layer to the second polysilicon layer, and an upper insulating layer positioned between the first and second conductive plugs, wherein the upper insulating layer insulates the first conductive plug from direct contact with the upper conductive layer.

15. The memory cell array of claim 14 wherein first said conductive plug is formed over a field oxide region.

16. The memory cell array of claim 14 wherein said first conductive plug comprises a tungsten plug.

17. The memory cell array of claim 14, wherein said second conductive plug has a bottom surface that contacts a top surface of the second polysilicon layer.

* * * * *

UNITED STATES PATENT AND TRADEMARK OFFICE
CERTIFICATE OF CORRECTION

PATENT NO.     : 6,548,857 B2
DATED          : April 15, 2003
INVENTOR(S)    : Giovanna Dalla Libera et al.

It is certified that error appears in the above-identified patent and that said Letters Patent is hereby corrected as shown below:

<u>Title page,</u>
Insert:
-- [30]   Foreign Application Priority Data
          October 21, 1998  (EP) ........................98830628.8 --

Signed and Sealed this

Nineteenth Day of August, 2003

JAMES E. ROGAN
*Director of the United States Patent and Trademark Office*